US012637762B2

(12) United States Patent
Imagawa et al.

(10) Patent No.: US 12,637,762 B2
(45) Date of Patent: May 26, 2026

(54) SiC FORMED BODY AND METHOD FOR PRODUCING SiC FORMED BODY

(71) Applicant: TOKAI CARBON CO., LTD., Tokyo (JP)

(72) Inventors: Mayuri Imagawa, Tokyo (JP); Shohei Oishi, Tokyo (JP); Akihiro Kuroyanagi, Tokyo (JP); Reiko Yashikida, Tokyo (JP)

(73) Assignee: TOKAI CARBON CO., LTD., Tokyo (JP)

( * ) Notice: Subject to any disclaimer, the term of this patent is extended or adjusted under 35 U.S.C. 154(b) by 0 days.

(21) Appl. No.: 18/835,005

(22) PCT Filed: Nov. 14, 2023

(86) PCT No.: PCT/JP2023/040933
§ 371 (c)(1),
(2) Date: Jul. 31, 2024

(87) PCT Pub. No.: WO2024/116827
PCT Pub. Date: Jun. 6, 2024

(65) Prior Publication Data
US 2025/0154647 A1 May 15, 2025

(30) Foreign Application Priority Data
Dec. 2, 2022 (JP) ................................. 2022-193588

(51) Int. Cl.
*C23C 16/32* (2006.01)
*C23C 16/52* (2006.01)
*C23C 16/56* (2006.01)

(52) U.S. Cl.
CPC ............ *C23C 16/325* (2013.01); *C23C 16/52* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 2005/0123713 A1 | 6/2005 | Forrest et al. | |
| 2007/0042153 A1* | 2/2007 | Forrest .................. | C23C 16/325 |
| | | | 427/248.1 |
| 2010/0291328 A1 | 11/2010 | Forrest et al. | |
| 2010/0297350 A1 | 11/2010 | Forrest et al. | |
| 2020/0190692 A1* | 6/2020 | Daigo ............... | H10D 62/8325 |
| 2022/0341054 A1 | 10/2022 | Ushijima et al. | |
| 2022/0344452 A1* | 10/2022 | Ushijima .............. | C01B 32/977 |

FOREIGN PATENT DOCUMENTS

| | | |
|---|---|---|
| EP | 1 205 573 A1 | 5/2002 |
| JP | 2001-220237 A | 8/2001 |
| JP | 2007-513257 A | 5/2007 |
| JP | 2021-54666 A | 4/2021 |
| JP | 2021-54667 A | 4/2021 |
| KR | 2012-0007115 A | 1/2012 |

OTHER PUBLICATIONS

International Search Report for PCT/JP2023/040933 (in Japanese and English), Date of mailing: Feb. 6, 2024.
Fu, X. A. et al.: "Nitrogen Doped Polycrystalline 3C—SiC Films Deposited by LPCVD for MEMs Applications", Transducers & Eurosensors '07, Jun. 10, 2007, pp. 509-512.

* cited by examiner

*Primary Examiner* — Michael G Miller
(74) *Attorney, Agent, or Firm* — Hoffmann & Baron, LLP

(57) ABSTRACT

An object of the present disclosure is to provide a SiC formed body having low resistance and a method for producing the SiC formed body. The present disclosure provides a SiC formed body wherein a volume resistivity thereof is $7.0 \times 10^{-3}$ $\Omega \cdot$cm or less, and a nitrogen concentration thereof is in a range exceeding 1000 ppm and up to 4500 ppm.

3 Claims, No Drawings

SiC FORMED BODY AND METHOD FOR PRODUCING SiC FORMED BODY

CROSS-REFERENCE TO RELATED APPLICATIONS

This application is the National Stage of International Application No. PCT/JP2023/040933, filed on Nov. 14, 2023, which claims priority to Japanese Patent Application No. 2022-193588, filed on Dec. 2, 2022, the entire contents of which are incorporated by reference herein in their entireties.

TECHNICAL FIELD

The present disclosure relates to a SiC formed body and a method for producing a SiC formed body.

BACKGROUND ART

One example of the important characteristics of silicon carbide (SiC) formed bodies is their electrical characteristics. For example, various SiC formed bodies having a specific resistivity have been proposed.

Patent Literature 1 below discloses a silicon carbide body obtained by a CVD method. The silicon carbide body contains 0.1 to 100 ppm of nitrogen element and has a specific electrical resistance of 0.01 to 10 ($\Omega$·cm. Furthermore, the content of metal elements other than silicon is 10 ppm or less.

Patent Literature 2 below discloses a polycrystalline SiC formed body having a resistivity of 0.050 ($\Omega$·cm or less.

CITATION LIST

Patent Literature

[Patent Literature 1] Japanese Patent Application Publication No. 2001-220237
[Patent Literature 2] Japanese Patent Application Publication No. 2021-054667

SUMMARY OF INVENTION

An object of the present disclosure is to provide a SiC formed body having low resistance and a method for producing the SiC formed body.

Means for Solution of the Problems

The present disclosure includes the following embodiments.
<1> A SiC formed body having a volume resistivity of $7.0 \times 10^{-3}$ $\Omega$·cm or less and a nitrogen concentration in a range of more than 1000 ppm and up to 4500 ppm.
<2> The SiC formed body according to <1>, wherein a ratio of $CN^-$ peak intensity to SiN– peak intensity measured by time-of-flight secondary ion mass spectrometry is 1.2 or more.
<3> The SiC formed body according to <1> or <2>, wherein the volume resistivity is $5.0 \times 10^{-3}$ $\Omega$·cm or less.
<4> A method for producing a SiC formed body according to <1>, comprising: preparing a substrate in a reaction chamber; supplying a raw material gas containing silicon and carbon, a nitrogen-containing dopant gas, a carrier gas, and hydrogen chloride gas into the reaction chamber to form a SiC film on the substrate; and removing the substrate from the SiC film, wherein the partial pressure of the hydrogen chloride gas in the reaction chamber during the process of forming the SiC film is 1000 Pa or more.

Effects of Invention

According to one embodiment of the present disclosure, a SiC formed body having low resistance is provided.

DESCRIPTION OF EMBODIMENTS

Embodiments of the present disclosure will be described in detail below. The embodiments described below may be appropriately modified without departing from the gist of the present disclosure.

In the present disclosure, ordinal numbers (e.g., "first" and "second") are terms used to distinguish elements and do not limit the number of elements, the order of elements, or the superiority or inferiority of elements.

The SiC formed body according to one embodiment of the present disclosure has the following characteristics. The volume resistivity of the SiC formed body is $7.0 \times 10^{-3}$ $\Omega$·cm or less, and the nitrogen concentration in the SiC formed body is in a range exceeding 1000 ppm and up to 4500 ppm. According to this embodiment, a SiC formed body having low resistance is provided. The SiC formed body is preferably a polycrystalline SiC formed body.

The volume resistivity of the SiC formed body is $7.0 \times 10^{-3}$ $\Omega$·cm or less. The volume resistivity of the SiC formed body is preferably $5.0 \times 10^{-3}$ $\Omega$·cm or less, more preferably $3.0 \times 10^{-3}$ $\Omega$·cm or less, and further preferably $1.0 \times 10^{-3}$ $\Omega$·cm or less. For example, a SiC formed body having low resistance is suitable for use in members for plasma etching apparatuses. The lower limit of the volume resistivity is not limited in the purpose of obtaining a SiC formed body having low resistance. The lower limit of the volume resistivity may be $0.1 \times 10^{-3}$ $\Omega$·cm, $7.0 \times 10^{-3}$ $\Omega$·cm, or $5.0 \times 10^{-3}$ $\Omega$·cm. For example, the volume resistivity may be in the range of $0.1 \times 10^{-3}$ $\Omega$·cm to $7.0 \times 10^{-3}$ $\Omega$·cm. In the present disclosure, the volume resistivity is measured by the four-probe method. As an example of a measuring device, "Loresta-GP MCT-T610" (Mitsubishi Chemical Analytech Co., Ltd.) can be mentioned.

The nitrogen concentration in the SiC formed body is in a range exceeding 1000 ppm and up to 4500 ppm. As the nitrogen concentration in the SiC formed body increases, the volume resistivity tends to decrease. From the viewpoint of reducing the volume resistivity, the nitrogen concentration is preferably 1500 ppm or more, more preferably 2000 ppm or more, and further preferably 2500 ppm or more. The upper limit of the nitrogen concentration may be 4000 ppm, 3500 ppm, or 3000 ppm. In the present disclosure, the nitrogen concentration is measured by secondary ion mass spectrometry (SIMS).

Regarding the SiC formed body, as the ratio of $CN^-$ peak intensity to $SiN^-$ peak intensity measured by time-of-flight secondary ion mass spectrometry (TOF-SIMS) increases, the volume resistivity tends to decrease. TOF-SIMS is a technique for analyzing a solid sample surface by irradiating the solid sample with primary ions and detecting secondary ions emitted from the solid sample surface. Hereinafter, "the ratio of $CN^-$ peak intensity to $SiN^-$ peak intensity" is referred to as "$CN^-/SiN^-$ peak intensity ratio." From the viewpoint of reducing the volume resistivity, the $CN^-/SiN^-$ peak intensity ratio is preferably 1 or more, more preferably 1.2 or more, and further preferably 1.5 or more. Furthermore, the $CN^-/SiN^-$ peak intensity ratio is preferably 2.0 or more and more preferably 2.5 or more. Although the reason why the volume resistivity decreases is not fully understood, it is presumed that the decrease in volume resistivity is due to differences in crystal structure as follows. Generally, nitrogen (N) introduced into SiC is considered to preferentially occupy carbon (C) sites compared to silicon (Si) sites in the SiC crystal. In this case, the $CN^-/SiN^-$ peak intensity ratio tends to be small. In contrast, an increase in the $CN^-/SiN^-$ peak intensity ratio suggests that nitrogen (N) preferentially occupies silicon (Si) sites in the SiC crystal. Alternatively, the positions of the atoms in the crystal structure may be slightly shifted. It is presumed that such differences in the crystal structure affect the energy levels, thereby lowering the volume resistivity. The upper limit of the $CN^-/SiN^-$ peak intensity ratio is not limited as long as a SiC formed body having a desired volume resistivity is provided. The upper limit of the $CN^-/SiN^-$ peak intensity ratio may be 3.0 or 4.0. For example, the $CN^-/SiN^-$ peak intensity ratio may be in the range of 1.0 to 4.0.

The Si:C molar ratio in the SiC formed body is preferably 49.00:51.00 to 51.00:49.00, and more preferably 49.50: 50.50 to 50.50:49.50. In the present disclosure, the Si:C molar ratio is measured by secondary ion mass spectrometry (SIMS).

The shape of the SiC formed body is not limited. The shape of the SiC formed body may be determined in consideration of the application. The SiC formed body may be a plate-shaped SiC formed body. The SiC formed body may be a disk-shaped, ring-shaped, cylindrical, or rod-shaped SiC formed body. Examples of applications of a disk-shaped or ring-shaped SiC formed body include semiconductor members. Examples of applications of a cylindrical or rod-shaped SiC formed body include heater components.

The thickness of the SiC formed body is not limited. The thickness of the SiC formed body may be determined in consideration of the application. The thickness of the SiC formed body may be at least 0.15 mm. The thickness of the SiC formed body may be at least 0.35 mm. The thickness of the SiC formed body may be at least 4 mm. The thickness of the SiC formed body may be in the range of 0.1 mm to 5 mm. The thickness of the SiC formed body may be in the range of 0.2 mm to 3 mm.

The application of the SiC formed body is not limited. Examples of applications of the SiC formed body include members for semiconductor manufacturing apparatuses. Examples of semiconductor manufacturing apparatuses include plasma etching apparatuses and heat treatment apparatuses. Examples of members for plasma etching apparatuses include edge rings, electrode plates, and heaters. Examples of members for heat treatment apparatuses include dummy wafers. Examples of applications of the SiC formed body also include members for reaction chambers of thin film forming apparatuses. Examples of thin film forming apparatuses include CVD apparatuses. CVD is an abbreviation for Chemical Vapor Deposition.

The method for producing the SiC formed body is not limited as long as the desired SiC formed body is obtained. For example, the SiC formed body is produced by utilizing chemical vapor deposition. In a preferred embodiment, the method for producing the SiC formed body comprises: (1) preparing a substrate in a reaction chamber; (2) supplying a raw material gas containing silicon and carbon, a nitrogen-containing dopant gas, and a carrier gas into the reaction chamber to form a SiC film on the substrate; and (3) removing the substrate from the SiC film. Each step will be described below.

Step (1) will be described below. Step (1) includes preparing a substrate in a reaction chamber.

The number of substrates disposed in the reaction chamber is not limited. One or more substrates may be disposed in one reaction chamber.

The reaction chamber defines a space for performing a reaction to form a SiC film on a substrate. The thin film forming apparatus including the reaction chamber may be selected from known CVD apparatuses. The CVD apparatus may be a hot-wall type CVD apparatus or a cold-wall type CVD apparatus.

The substrate is preferably a graphite substrate. The shape and dimensions of the substrate may be determined in consideration of the shape and dimensions of the desired SiC film. The substrate may be a disk-shaped substrate. The thickness of the substrate may be in the range of 0.5 mm to 100 mm.

Step (2) will be described below. Step (2) includes supplying a raw material gas containing both silicon and carbon, a nitrogen-containing dopant gas, and a carrier gas into the reaction chamber to form a SiC film on the substrate. Hereinafter, "raw material gas containing both silicon and carbon" may be simply referred to as "raw material gas," and "nitrogen-containing dopant gas" may be simply referred to as "dopant gas."

The raw material gas contains both silicon (Si) and carbon (C). The raw material gas is a source of SiC. The type of raw material gas containing both silicon (Si) and carbon (C) is not limited. The raw material gas may be a single-component gas or a multi-component gas. Examples of single-component gases include organosilicon compounds having a silicon-carbon bond. Examples of organosilicon compounds having a silicon-carbon bond include methyltrichlorosilane, trichlorophenylsilane, dichloromethylsilane, dichlorodimethylsilane, and chlorotrimethylsilane. The single-component gas is preferably methyltrichlorosilane. Examples of multi-component gases include mixtures containing both a silicon-containing compound and a carbon-containing compound. Examples of silicon-containing compounds include trichlorosilane and monosilane. The silicon-containing compound may be a compound that does not contain carbon. Examples of carbon-containing compounds include hydrocarbons. Examples of hydrocarbons include methane, ethane, and propane.

The dopant gas contains nitrogen (N). Examples of nitrogen-containing dopant gases include nitrogen gas ($N_2$) and ammonia gas ($NH_3$). The dopant gas is preferably nitrogen gas.

Examples of carrier gases include hydrogen gas ($H_2$).

In addition to the raw material gas, dopant gas, and carrier gas, other gases may be supplied into the reaction chamber. Examples of other gases include hydrogen chloride (HCl) gas. The use of hydrogen chloride gas can contribute to an increase in the nitrogen concentration in the SiC formed body or an improvement in the oxidation resistance of the SiC formed body.

At least one gas may be supplied into the reaction chamber separately from the other gases. At least two gases may be mixed before being supplied to the reaction chamber. In the latter case, a mixed gas containing at least two gases is supplied into the reaction chamber. For example, the mixed gas may include the raw material gas, the dopant gas, and the carrier gas. For example, the mixed gas may include the raw material gas, the dopant gas, the carrier gas, and the hydrogen chloride gas. The partial pressure of each gas constituting the mixed gas may be adjusted within the following numerical ranges. The partial pressure of the raw material gas may be in the range of 0.0030 MPa to 0.0150 MPa. The lower limit of the partial pressure of the raw material gas may be 0.0030 MPa, 0.0040 MPa, or 0.0050 MPa. The upper limit of the partial pressure of the raw material gas may be 0.0150 MPa, 0.0130 MPa, or 0.0100 MPa. The partial pressure of the dopant gas may be in the range of 0.0100 MPa to 0.0600 MPa. The lower limit of the partial pressure of the dopant gas may be 0.0100 MPa, 0.0200 MPa, or 0.0300 MPa. The upper limit of the partial pressure of the dopant gas may be 0.0600 MPa, 0.0500 MPa, or 0.0400 MPa. The partial pressure of the carrier gas may be in the range of 0.0300 MPa to 0.1000 MPa. The lower limit of the partial pressure of the carrier gas may be 0.0300 MPa, 0.0400 MPa, or 0.0500 MPa. The upper limit of the partial pressure of the carrier gas may be 0.1000 MPa, 0.0800 MPa, or 0.0600 MPa. The partial pressure of the hydrogen chloride gas may be in the range of 0.0008 MPa to 0.0020 MPa. The lower limit of the partial pressure of the hydrogen chloride may be 0.0008 MPa, 0.0009 MPa, or 0.0010 MPa. The upper limit of the partial pressure of the hydrogen chloride may be 0.0020 MPa, 0.0018 MPa, or 0.0015 MPa.

The molar ratio of nitrogen (N) in the dopant gas to silicon (Si) in the raw material gas is preferably in the range of 4.0 to 24.0, more preferably in the range of 5.0 to 20.0, and further preferably in the range of 6.0 to 16.0. If the molar ratio is 4.0 or more, the amount of nitrogen incorporated into the SiC film increases. If the molar ratio is 24.0 or less, the productivity improves.

The ratio of the total flow rate of all gases supplied into the reaction chamber to the surface area of the substrate is preferably 0.007 $L/(min \cdot cm^2)$ or less, more preferably 0.006 $L/(min \cdot cm^2)$ or less, and further preferably 0.005 $L/(min \cdot cm^2)$ or less. As the total flow rate of all gases supplied into the reaction chamber relative to the surface area of the substrate becomes smaller, the amount of nitrogen incorporated into the SiC film tends to increase. As a result, the nitrogen concentration in the SiC formed body increases, and the volume resistivity of the SiC formed body also decreases. The lower limit of the ratio of the total flow rate of all gases supplied into the reaction chamber to the surface area of the substrate is not limited. The lower limit may be 0.001 $L/(min \cdot cm^2)$ or 0.003 $L/(min \cdot cm^2)$. For example, the ratio of the total flow rate of all gases supplied into the reaction chamber to the surface area of the substrate may be in the range of 0.001 $L/(min \cdot cm^2)$ to 0.007 $L/(min \cdot cm^2)$.

The film formation rate of the SiC film is preferably 10 μm/hr to 2000 μm/hr. If the film formation rate of the SiC film is 10 μm/hr or more, the productivity improves. If the film formation rate of the SiC film is 2000 μm/hr or less, the formation of the crystal structure is promoted, or defects in the crystal structure are reduced.

The SiC film is preferably formed by heat treatment. The SiC film is preferably formed at a temperature in the range of 1100° C. to 1900° C., more preferably in the range of 1200° C. to 1600° C. The heat treatment may be carried out by heating the substrate. The temperature of the substrate may be adjusted based on the numerical values as described above. Examples of methods for heating the substrate include resistance heating, induction heating, and laser heating.

The SiC film is preferably formed under a pressure in the range of 0.08 MPa to 0.12 MPa, more preferably in the range of 0.09 MPa to 0.11 MPa. The pressure in the reaction chamber during the process of forming the SiC film is adjusted based on the numerical values as described above.

The partial pressure of the hydrogen chloride gas in the reaction chamber during the process of forming the SiC film is preferably 1000 Pa or more, more preferably 1500 Pa or more, and further preferably 2000 Pa or more. As the partial pressure of the hydrogen chloride gas in the reaction chamber increases, the substitution of silicon (Si) by nitrogen (N) becomes dominant. As a result, the volume resistivity of the SiC formed body decreases. From the viewpoint of improving the oxidation resistance of the SiC formed body, the partial pressure of the hydrogen chloride gas in the reaction chamber during the process of forming the SiC film is preferably 3000 Pa or less. For example, the partial pressure of the hydrogen chloride gas in the reaction chamber during the process of forming the SiC film may be in the range of 1000 Pa to 3000 Pa. In the present disclosure, the partial pressure of the hydrogen chloride gas in the reaction chamber during the process of forming the SiC film is measured by utilizing gas chromatography. Specifically, the gas extracted from the reaction chamber during the process of forming the SiC film is analyzed by gas chromatography, and then the partial pressure of the hydrogen chloride gas in the reaction chamber during the process of forming the SiC film is calculated based on the concentration of each component in the gas and the pressure in the reaction chamber. The term "hydrogen chloride gas in the reaction chamber during the process of forming the SiC film" means all hydrogen chloride gas present in the reaction chamber during the process of forming the SiC film, and includes not only the hydrogen chloride gas supplied into the reaction chamber during the process of forming the SiC film but also the hydrogen chloride gas generated by the decomposition of the raw material gas.

Step (3) will be described below. Step (3) includes removing the substrate from the SiC film. The SiC formed body is obtained by removing the substrate.

The method for removing the substrate is not limited. Examples of methods for removing the substrate include machining and oxidation.

The method for producing the SiC formed body may further include other steps as needed. In one embodiment, the method for producing the SiC formed body may include processing the SiC film between step (2) and step (3). Examples of processing include machining. The SiC film may be processed into a predetermined shape or size. In the processing of the SiC film, the substrate may also be processed together with the SiC film. In one embodiment, the method for producing the SiC formed body may include processing the SiC formed body after step (3). The SiC formed body may be processed into a predetermined shape or size. The SiC formed body may be processed by surface treatment. Examples of surface treatment include mirror finishing.

EXAMPLES

The present disclosure will be described below based on examples. However, the present disclosure is not limited to the following examples. The technical matters described below may be appropriately modified without departing from the gist of the present disclosure.

Example 1

A graphite substrate having a diameter of 160 mm and a thickness of 5 mm was prepared.

The graphite substrate was disposed in a reaction chamber of a CVD apparatus. The following gases (A) to (D) were mixed to generate a mixed gas. The partial pressure of each gas is shown in Table 1. After supplying the mixed gas into the reaction chamber, a polycrystalline SiC film was formed on the graphite substrate. Other detailed conditions are shown in Table 2.

(A) Raw material gas: Methyltrichlorosilane (hereinafter referred to as "MTS")

(B) Dopant gas: $N_2$ (C) Carrier gas: $H_2$ (D) Other gas: Hydrogen chloride (HCl)

After forming a polycrystalline SiC film having a thickness of 0.6 mm, a laminate including the graphite substrate and the polycrystalline SiC film was taken out of the reaction chamber. The laminate was processed, and then the graphite substrate was removed to obtain a polycrystalline SiC formed body having a diameter of 150 mm and a thickness of 0.6 mm. In the processing of the laminate, the edge of the laminate was removed, and then the laminate was divided. The polycrystalline SiC formed body has a first surface and a second surface on the opposite side of the first surface. The first surface and the second surface of the polycrystalline SiC formed body face opposite directions from each other. The first surface of the polycrystalline SiC formed body is the surface of the polycrystalline SiC formed body exposed by the removal of the graphite substrate. Each of the first surface and the second surface of the polycrystalline SiC formed body was ground by at least 50 μm by surface grinding. The completed polycrystalline SiC formed body has a diameter of 150 mm and a thickness of 0.5 mm.

Examples 2 to 10 and Comparative Examples 1 to 5

SiC formed bodies were obtained according to the method described in Example 1, except that the conditions for forming the polycrystalline SiC film were changed according to the descriptions of Table 1 and Table 2.

Measurement

The characteristics of each polycrystalline SiC formed body obtained in the above examples and comparative examples were investigated. The measurement methods and results will be described below.

Nitrogen Concentration

The nitrogen concentration in the polycrystalline SiC formed body was measured by secondary ion mass spectrometry. "SIMS-4000" (ATOMIKA) was used as the measuring device. The measurement results are shown in Table 3.

$CN^-/SiN^-$ Peak Intensity Ratio

The $SiN^-$ peak intensity and $CN^-$ peak intensity were measured by time-of-flight secondary ion mass spectrometry. "TOF.SIMS 5" (IONTOF GmbH) was used as the measuring device. The measurement conditions are shown below. The ratio of $CN^-$ peak intensity to $SiN^-$ peak intensity was calculated. The measurement results are shown in Table 3.

(1) Primary ion species: $Bi^+$ (2) Acceleration voltage: 30 kV (3) Measurement field of view size: 200 μm×200 μm (4) Number of pixels: 1024 pixel×1024 pixel (5) Measured ion species: Negative ion

Volume Resistivity

The volume resistivity of the polycrystalline SiC formed body was measured by the four-probe method. "Loresta-GP MCT-T610" (Mitsubishi Chemical Analytech Co., Ltd.) was used as the measuring device. Specifically, the probe of the measuring device was brought into contact with the first surface of the polycrystalline SiC formed body to measure the volume resistivity. The measurement results are shown in Table 3.

Surface Roughness Sa after Oxidation Test

The surface roughness Sa of the polycrystalline SiC formed body was adjusted to 0.2±0.1 nm by mirror finishing to form an analysis surface. With the analysis surface of the polycrystalline SiC formed body exposed, heat treatment was performed at 950° C. in an air atmosphere for 1 hour using a Kanthal furnace. The surface roughness Sa after the oxidation test was measured using a non-contact surface roughness measuring device utilizing white light interferometry under the conditions of a field of view of 1.5 mm square and a magnification of 5 times. The measurement results are shown in Table 2. A small difference between the surface roughness Sa before the oxidation test and the surface roughness Sa after the oxidation test indicates excellent oxidation resistance.

Si:C Molar Ratio

The components of the polycrystalline SiC formed body were measured within the depth direction analysis range of 0.1 μm to 8.0 μm using secondary ion mass spectrometry (SIMS), and the Si: C molar ratio was measured. The measurement results are shown in Table 3.

TABLE 1

| | Conditions: Partial pressure of each gas (MPa) | | | |
| --- | --- | --- | --- | --- |
| | Raw Material Gas (MTS) | Dopant Gas ($N_2$) | Carrier Gas ($H_2$) | Other Gas (HCl) |
| Example 1 | 0.0050 | 0.0300 | 0.0600 | 0.0009 |
| Example 2 | 0.0050 | 0.0300 | 0.0600 | 0.0015 |
| Example 3 | 0.0040 | 0.0400 | 0.0600 | 0.0008 |
| Example 4 | 0.0050 | 0.0300 | 0.0600 | 0.0013 |
| Example 5 | 0.0130 | 0.0400 | 0.0500 | 0.0011 |
| Example 6 | 0.0130 | 0.0400 | 0.0500 | 0.0011 |
| Example 7 | 0.0130 | 0.0400 | 0.0500 | 0.0009 |
| Example 8 | 0.0090 | 0.0500 | 0.0400 | 0.0010 |
| Example 9 | 0.0050 | 0.0300 | 0.0600 | 0.0019 |
| Example 10 | 0.0040 | 0.0400 | 0.0600 | 0.0008 |
| Comparative Example 1 | 0.0050 | 0.0300 | 0.0600 | 0.0005 |
| Comparative Example 2 | 0.0060 | 0.0100 | 0.0800 | 0.0004 |
| Comparative Example 3 | 0.0050 | 0.0300 | 0.0600 | 0.0007 |
| Comparative Example 4 | 0.0050 | 0.0300 | 0.0600 | 0.0006 |
| Comparative Example 5 | 0.0060 | 0.0100 | 0.0800 | 0.0005 |

TABLE 2

| | | Conditions | | | | |
|---|---|---|---|---|---|---|
| | Reaction Temperature ° C. | Dopant Gas N/Raw Material Gas Si Molar Ratio — | Mixed Gas Flow Rate/Substrate Surface Area L/(min · cm²) | Pressure in Reaction Chamber During SiC Film Formation MPa | Partial Pressure of Hydrogen Chloride Gas During SiC Film Formation Pa | Film Formation Rate μm/hr |
| Example 1 | 1410 | 11.2 | 0.006 | 0.0959 | 1200 | 28 |
| Example 2 | 1410 | 11.2 | 0.005 | 0.0965 | 2133 | 25 |
| Example 3 | 1430 | 17.6 | 0.007 | 0.1048 | 1066 | 30 |
| Example 4 | 1410 | 10.4 | 0.005 | 0.0963 | 1733 | 26 |
| Example 5 | 1310 | 6.0 | 0.001 | 0.1041 | 1200 | 616 |
| Example 6 | 1260 | 6.0 | 0.001 | 0.1041 | 1333 | 452 |
| Example 7 | 1360 | 6.0 | 0.002 | 0.1039 | 1066 | 743 |
| Example 8 | 1400 | 10.0 | 0.007 | 0.1000 | 1066 | 1530 |
| Example 9 | 1410 | 12.4 | 0.005 | 0.0969 | 2666 | 20 |
| Example 10 | 1420 | 15.0 | 0.007 | 0.1048 | 1066 | 32 |
| Comparative Example 1 | 1410 | 11.2 | 0.008 | 0.0955 | 667 | 37 |
| Comparative Example 2 | 1420 | 6.6 | 0.010 | 0.0964 | 533 | 40 |
| Comparative Example 3 | 1410 | 11.2 | 0.009 | 0.0957 | 933 | 34 |
| Comparative Example 4 | 1380 | 11.6 | 0.010 | 0.0956 | 866 | 20 |
| Comparative Example 5 | 1450 | 6.6 | 0.015 | 0.0965 | 667 | 50 |

TABLE 3

| | | | Measurement | | |
|---|---|---|---|---|---|
| | N Concentration ppm | CN⁻/SiN⁻ Peak Intensity Ratio — | Volume Resistivity Ω · cm | Surface Roughness Sa After Oxidation Test nm | Si:C Molar Ratio — |
| Example 1 | 1812 | 2.0 | $2.1 \times 10^{-3}$ | 0.19 | 50.12:49.88 |
| Example 2 | 2975 | 3.6 | $0.6 \times 10^{-3}$ | 0.22 | 49.95:50.05 |
| Example 3 | 1022 | 1.6 | $5.2 \times 10^{-3}$ | 0.18 | 50.22:49.78 |
| Example 4 | 2677 | 3.5 | $0.9 \times 10^{-3}$ | 0.21 | 49.98:50.02 |
| Example 5 | 1141 | 2.1 | $3.0 \times 10^{-3}$ | 0.20 | 50.25:49.75 |
| Example 6 | 1900 | 2.2 | $2.2 \times 10^{-3}$ | 0.17 | 50.27:49.73 |
| Example 7 | 1015 | 1.5 | $5.1 \times 10^{-3}$ | 0.15 | 50.21:49.79 |
| Example 8 | 1101 | 1.7 | $3.8 \times 10^{-3}$ | 0.16 | 50.15:49.85 |
| Example 9 | 3646 | 3.7 | $0.5 \times 10^{-3}$ | 0.25 | 49.90:50.10 |
| Example 10 | 1009 | 1.1 | $5.0 \times 10^{-3}$ | 0.18 | 50.23:49.77 |
| Comparative Example 1 | 400 | 1.0 | $13.3 \times 10^{-3}$ | 0.16 | 50.40:49.60 |
| Comparative Example 2 | 365 | 1.0 | $15.0 \times 10^{-3}$ | 0.15 | 50.38:49.62 |
| Comparative Example 3 | 750 | 1.1 | $7.9 \times 10^{-3}$ | 0.18 | 50.15:49.85 |
| Comparative Example 4 | 585 | 1.1 | $8.3 \times 10^{-3}$ | 0.17 | 50.21:49.79 |
| Comparative Example 5 | 486 | 1.0 | $10.2 \times 10^{-3}$ | 0.18 | 50.17:49.83 |

Consideration of Results

The volume resistivity of the polycrystalline SiC formed bodies obtained in Examples 1 to 10 is $7.0 \times 10^{-3}$ Ω·cm or less. In contrast, the resistivity of the polycrystalline SiC formed bodies obtained in Comparative Examples 1 to 5 exceeds $7.0 \times 10^{-3}$ Ω·cm.

The invention claimed is:

1. A SiC formed body having a volume resistivity of $7.0 \times 10^{-3}$ Ω·cm or less, a nitrogen concentration in a range of more than 1000 ppm and up to 4500 ppm, and a ratio of CN⁻ peak intensity to SiN⁻ peak intensity of 1.2 or more, as measured by time-of-flight secondary ion mass spectrometry.

2. The SiC formed body according to claim 1, wherein the volume resistivity is $5.0 \times 10^{-3}$ Ω·cm or less.

3. A method for producing a SiC formed body according to claim 1, comprising:

preparing a substrate in a reaction chamber;

supplying a raw material gas containing silicon and carbon, a nitrogen-containing dopant gas, a carrier gas, and hydrogen chloride gas into the reaction chamber to
form a SiC film on the substrate; and
removing the substrate from the SiC film, wherein
the partial pressure of the hydrogen chloride gas in the
reaction chamber during the process of forming the SiC
film is 1000 Pa or more.

\* \* \* \* \*